(12) United States Patent
Lin et al.

(10) Patent No.: US 10,276,432 B2
(45) Date of Patent: *Apr. 30, 2019

(54) COMPOSITE CONTACT PLUG STRUCTURE AND METHOD OF MAKING SAME

(71) Applicant: Taiwan Semiconductor Manufacturing Company, Ltd., Hsinchu (TW)

(72) Inventors: Yu-Hung Lin, Taichung (TW); Sheng-Hsuan Lin, Zhubei (TW); Chih-Wei Chang, Hsinchu (TW); You-Hua Chou, Hsinchu (TW); Chia-Lin Hsu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/860,447

(22) Filed: Jan. 2, 2018

(65) Prior Publication Data

US 2018/0144978 A1    May 24, 2018

Related U.S. Application Data

(63) Continuation of application No. 14/313,111, filed on Jun. 24, 2014.

(Continued)

(51) Int. Cl.
*H01L 21/768* (2006.01)
*H01L 23/538* (2006.01)
(Continued)

(52) U.S. Cl.
CPC .. *H01L 21/76847* (2013.01); *H01L 21/28518* (2013.01); *H01L 21/76802* (2013.01);
(Continued)

(58) Field of Classification Search
CPC .......... H01L 23/5226; H01L 21/76802; H01L 21/76843; H01L 23/53266
(Continued)

(56) References Cited

U.S. PATENT DOCUMENTS 5,889,328 A    3/1999  Joshi et al.
6,429,493 B1   8/2002  Asahina et al.
(Continued)

FOREIGN PATENT DOCUMENTS

CN    101034695 A    9/2007
CN    101572246 A    11/2009
(Continued)

OTHER PUBLICATIONS

Saito, et al., "A Reliability Study of Barrier-Metal-Clad Copper Interconnects With Self-Aligned Metallic Caps," IEEE Transactions on Electron Devices, vol. 51, No. 12, Dec. 2004.

*Primary Examiner* — Caleen O Sullivan
(74) *Attorney, Agent, or Firm* — Slater Matsil, LLP

(57) ABSTRACT

An embodiment contact plug includes a bilayer structure and a diffusion barrier layer on a sidewall and a bottom surface of the bilayer structure. The bilayer structure includes a conductive core and a conductive liner on a sidewall and a bottom surface of the conductive core. In the embodiment contact plug, the conductive liner comprises cobalt or ruthenium.

19 Claims, 6 Drawing Sheets

Related U.S. Application Data

(60) Provisional application No. 61/986,740, filed on Apr. 30, 2014.

(51) Int. Cl.
  *H01L 23/532*  (2006.01)
  *H01L 23/522*  (2006.01)
  *H01L 23/485*  (2006.01)
  *H01L 23/48*  (2006.01)
  *H01L 21/285*  (2006.01)

(52) U.S. Cl.
  CPC .. *H01L 21/76828* (2013.01); *H01L 21/76843* (2013.01); *H01L 21/76846* (2013.01); *H01L 21/76855* (2013.01); *H01L 23/485* (2013.01); *H01L 23/5226* (2013.01); *H01L 23/5384* (2013.01); *H01L 23/53252* (2013.01); *H01L 23/53266* (2013.01); *H01L 23/481* (2013.01); *H01L 2924/0002* (2013.01)

(58) Field of Classification Search
  USPC ........................................................ 257/751
  See application file for complete search history.

(56) References Cited

U.S. PATENT DOCUMENTS

| | | |
|---|---|---|
| 6,521,956 B1 | 2/2003 | Lee |
| 7,393,781 B2 | 7/2008 | Yakobson et al. |
| 7,465,664 B2 | 12/2008 | Ho et al. |
| 7,956,463 B2 | 6/2011 | Yang et al. |
| 8,222,139 B2 | 7/2012 | Chen et al. |
| 8,796,788 B2 | 8/2014 | Kwok et al. |
| 9,735,050 B2 * | 8/2017 | Lin .................. H01L 21/76847 |
| 2006/0251800 A1 | 11/2006 | Weidman et al. |
| 2007/0210448 A1 | 9/2007 | Wong et al. |
| 2007/0235321 A1 | 10/2007 | Cerio, Jr. |
| 2009/0087981 A1 | 4/2009 | Suzuki et al. |
| 2009/0289365 A1 | 11/2009 | Yang et al. |
| 2010/0038789 A1 | 2/2010 | Cheng et al. |
| 2011/0266638 A1 | 11/2011 | Frohberg et al. |
| 2012/0187460 A1 | 7/2012 | Lavoie et al. |
| 2014/0027909 A1 | 1/2014 | Gstrein et al. |
| 2014/0374907 A1 | 12/2014 | Yu et al. |
| 2015/0001720 A1 | 1/2015 | Lin et al. |
| 2015/0318243 A1 * | 11/2015 | Lin .................. H01L 21/28518 257/751 |

FOREIGN PATENT DOCUMENTS

| | | |
|---|---|---|
| CN | 102610637 A | 7/2012 |
| DE | 102010028458 A1 | 11/2011 |
| DE | 112010003659 T5 | 10/2012 |
| EP | 1094504 A2 | 4/2001 |
| JP | 2000195954 A | 7/2000 |
| KR | 20110014586 A | 2/2011 |
| KR | 20150001629 A | 1/2015 |

\* cited by examiner

COMPOSITE CONTACT PLUG STRUCTURE AND METHOD OF MAKING SAME

PRIORITY CLAIM AND CROSS-REFERENCE

This application is a continuation of U.S. application Ser. No. 14/313,111, filed Jun. 24, 2014 which claims the benefit of U.S. Provisional Application No. 61/986,740, filed on Apr. 30, 2014, entitled "Composite Plug with Low Resistance, Methods of Making Same, and Integrated Circuits Incorporating Same," which applications are hereby incorporated herein by reference.

BACKGROUND

Semiconductor devices are used in a variety of electronic applications, such as personal computers, cell phones, digital cameras, and other electronic equipment, as examples. Generally, a typical semiconductor device includes a substrate having active devices such as transistors and capacitors. These active devices are initially isolated from each other, and interconnect structures are subsequently formed over the active devices to create functional circuits. Such interconnect structures may include contact plugs, which may be electrically coupled to the active devices on the substrate.

A typical contact plug may include tungsten (W) due to its low resistivity (about 5.4 µΩ·cm) and high reliability. However, as dimensions of integrated circuits continue to scale to smaller sub-micron sizes in advanced node applications, it becomes an increasing challenge to reduce contact plug resistance while decreasing contact hole size. Improved structures and methods for manufacturing same are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
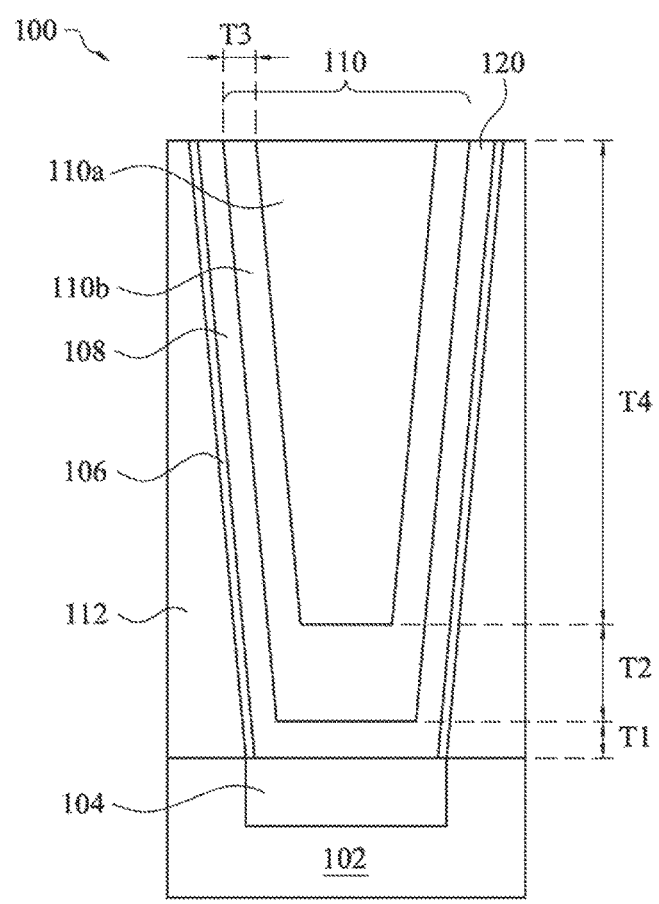
FIG. 1 illustrates cross-sectional views of a contact plug in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, aspects of the current disclosure are addressed generally. In general terms, embodiments described herein provide for a composite contact plug. The composite contact plug may include at least a bilayer structure having a cobalt (Co) or ruthenium (Ru) conductive liner on sidewalls and a bottom surface of a tungsten (W), Ru, or Co conductive core, for example. It has been observed that such a composite plug structure may be scaled down (e.g., for advanced node applications) while still maintaining low resistivity. Another advantageous feature of some embodiments is the good adhesion properties. Embodiments employing a diffusion barrier layer (e.g., comprising tantalum (Ta) or tantalum nitride (TaN) further exhibit low resistance and good adhesion. Another advantageous feature of some embodiments is that the bilayer plug exhibits high activation energy and melting point, which provides for good electro-migration (EM) resistance and electrical performance. Furthermore, by controlling the sidewall angles and/or thicknesses of various layers in the bilayer structure, the stress characteristics of the contact plug may be fine-tuned based on device design.

In general embodiments described herein may provide for one or more advantageous features including low resistance, high activation energy, high melting point, tunable stress, and good adhesion between the bilayer structure and the diffusion barrier layer, as will be described in further detail with regard to the illustrated embodiments.

With reference now to FIG. 1, a cross sectional view of an example composite contact plug 120 is provided. Contact plug 120 electrically contacts a silicide region 104 of an underlying structure, such as a silicided source/drain region or a silicided gate electrode. In the illustrated embodiment, the silicide region 104 is a self-aligned silicide (salicide) formed by annealing a conductive film 106. Conductive film 106 may be disposed on sidewalls and a bottom surface of contact plug 120 prior to annealing, and after annealing, portions of conductive film 106 may remain on sidewalls of contact plug 120. The remaining conductive film 106 on sidewalls of contact plug 120 may be due to conductive film 106 being less reactive with the material of dielectric layer 112. Furthermore, in some embodiments, some conductive film 106 may remain on a bottom surface of contact plug 120 even after annealing. In some embodiments, conductive film 106 may be a Co, W, titanium (Ti), nickel (Ni), and the like conductive liner, which may be used to form silicide region 104 comprising $TiSi_x$, $NiSi_x$, $WSi_x$, $CoSi_x$, and the like. The underlying silicided structure (e.g., substrate 102) could comprise silicon (Si), silicon germanium (SiGe), silicon phosphorous (SiP), silicon carbide (SiC), combinations thereof, and the like, for example. In other contemplated embodiments, the underlying structure could also be a metal or other conductor.

As further illustrated by FIG. 1, contact plug 120 includes a diffusion barrier layer 108 on sidewalls and a bottom surface of contact plug 120. Diffusion barrier layer 108 may be disposed atop conductive film 106. For example, conductive film 106 may be disposed between diffusion barrier layer 108 and substrate 102/silicide region 104. In various embodiments, diffusion barrier layer may comprise a relatively low-resistivity material, such as Ta or TaN, and diffusion barrier layer 108 may also act as a glue layer for contact plug 102.

Contact plug 120 further includes a bilayer structure 110. Diffusion barrier layer 108 is disposed on sidewalls and a bottom surface of bilayer structure 110. In various embodiments, diffusion barrier layer 108 may reduce or prevent diffusion of the conductive material of bilayer structure 110 into surrounding device features (e.g., dielectric layer 112). The illustrated bilayer structure 110 includes a conductive core 110a and a conductive liner 110b disposed on sidewalls and a bottom surface of conductive core 110a. Conductive liner 110b may comprise Co or Ru, and conductive core 110a may comprise W, Co, or Ru, for example. However, the conductive material of conductive core 110a and conductive liner 110b may comprise different materials. For example, various embodiments may include a bilayer structure 110 having a Co or Ru conductive liner 110b with a W conductive core 110a, a Co conductive liner 110b with a Ru conductive core 110a, or a Ru conductive liner 110b with a Co conductive core 110a.

It has been observed that the above combinations of conductive materials are suitable for bilayer structure 110 due to similar resistivity characteristics. For example, Co has a resistivity of 62.4 nΩ·m, W has a resistivity of 56.0 nΩ·m, and Ru has a resistivity of 71.0 nΩ·m. The use of Co or Ru for conductive liner 110a provides for good adhesion (e.g., conductive liner 110a may act as a glue layer) and reduces diffusion of the material of conductive core 110a (e.g., W in some embodiments) into surrounding device layers. Thus, Ta or TaN, which advantageously has a low resistivity, may be effectively used as a second diffusion barrier layer to reduce the diffusion of the materials of bilayer structure 110.

Furthermore, in some embodiments, diffusion barrier layer 106 has a thickness T1 of about 5 Å to about 100 Å. Conductive liner 110b has a thickness T2 along a bottom of contact plug 120 and a thickness T3 along sidewalls of contact plug 120. In some embodiments, thickness T2 may be about 100 Å to about 2000 Å, and thickness T3 may be 10 Å to about 200 Å. Conductive core 110a has a thickness T4 (e.g., measured from a top surface to a bottom surface) of from about 100 Å to about 2000 Å. The total height of contact plug 120 (as measured from a top surface to a bottom surface, or thickness T1 plus thickness T2 plus thickness T4 in FIG. 1) is about 500 Å to about 2000 Å in the illustrated embodiments. The thickness of both conductive core 110a and conductive liner 110b may be greater than the thickness of diffusion barrier layer 106 (e.g., thicknesses T4 and T2 may both be greater than thickness T1). In the various embodiments, sidewall angles of various layers in composite contact plug 120 and/or thicknesses T1, T2, T3, and/or T4 may be selected to provide a desired stress characteristics based on device design. For example, it has been observed that electron hole and/or current mobility of silicide region 104 may be influenced based on the stress characteristics of contact plug 120, and such stress characteristics may be fine-tuned by selecting appropriate sidewall angles and/or relative thicknesses for various layers (e.g., diffusion barrier layer 106, conductive liner 110b, and/or conductive core 110a) in contact plug 120.

All dimensions disclosed herein are by way of example only and not be way of limitation. It is contemplated that other structures and methods employing layers and features of these dimensions as well as other dimensions will be apparent to those skilled in the art once informed by the present disclosure—and such other structures, methods, and dimensions are within the contemplated scope of the present invention.

Figure 2:
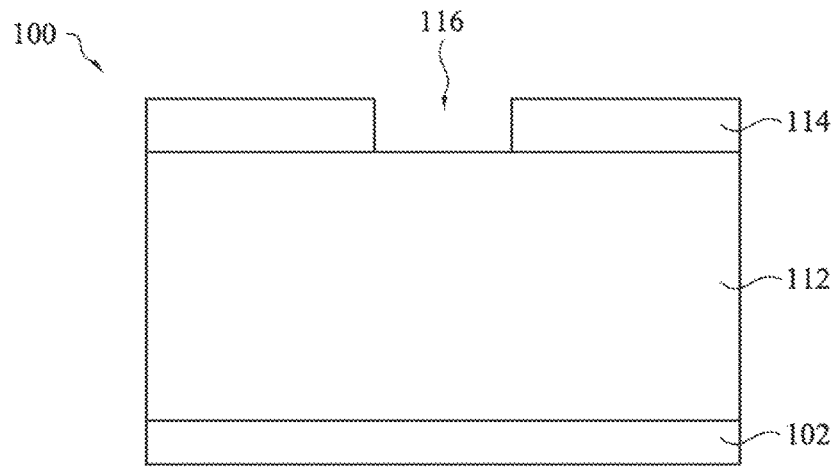
FIGS. 2 through 9 illustrate cross sectional views of various intermediary steps of manufacturing a contact plug in accordance with some embodiments.

FIGS. 2 through 9 illustrate cross sectional views of various intermediary stages of manufacturing a contact plug in accordance with some embodiments. FIG. 2 illustrates a die 100 having a substrate 102 and a dielectric layer 112 disposed over substrate 102. In subsequent process steps, a composite contact plug 120 may be formed in dielectric layer 112 to electrically connect to the underlying substrate 102. For example, substrate 102 may be a source/drain region or a gate electrode of an active device (e.g., a transistor). Substrate 102 may be, for example, a bulk silicon substrate, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 102 may include another elementary semiconductor, such as germanium; a compound semiconductor including SiC, gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Furthermore, substrate 120 may also comprise a polysilicon, metal, or other conductive material.

A dielectric layer 112 is disposed over substrate 102. In various embodiments, dielectric layer 112 may be a first inter-layer dielectric (ILD)/inter-metallization dielectric (IMD) layer. Dielectric layer 112 may be formed, for example, of a low-K dielectric material having a k value less than about 4.0 or even about 2.8. In some embodiments, dielectric layer 112 may comprise phosphosilicate glass (PSG), borophosphosilicate glass (BPSG), FSG, SiOxCy, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). Dielectric layer 112 may also comprise multiple layers, such as isolation layers, glue layers, buffer layers, and the like.

As further illustrated by FIG. 2, a patterned photoresist 114 is disposed over dielectric layer 112. Photoresist 114 may be deposited as a blanket layer over dielectric layer 112 using a spin-on process, lamination process, and the like. Next, portions of photoresist 114 may be exposed using a photo mask (not shown). Exposed or unexposed portions of photoresist 114 are then removed depending on whether a negative or positive resist is used, creating opening 116 extending through photoresist 114.

Figure 3:
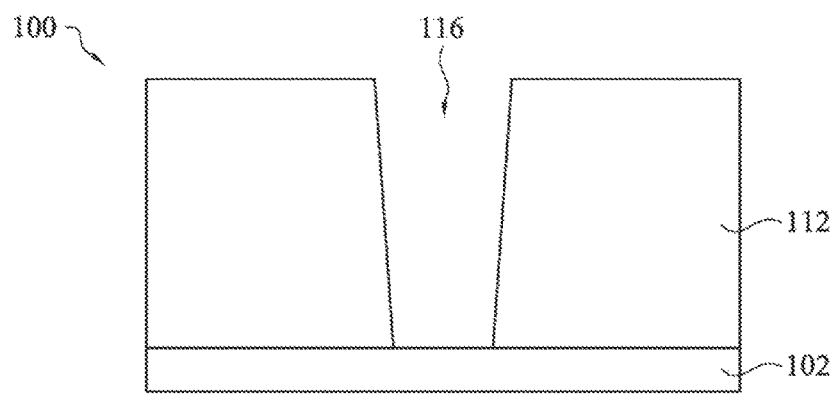

As illustrated by FIG. 3, dielectric layer 112 may be patterned using photoresist 114 as a patterning mask. For example, dry and/or wet etching techniques may be used to etch portions of dielectric layer 112 exposed by opening 116. The etching extends opening 116 through dielectric layer 112. Opening 116 may expose a region of the underlying substrate 102, such as, a source/drain region, a gate electrode, and the like. Subsequently, photoresist 114 is removed in an ashing and/or wet strip processes, for example. Although only one opening 116 is shown, any number of openings may be patterned in dielectric layer 112 (e.g., using a combination of photolithography and etching) depending on device design.

In some embodiments, other layers may be used in the patterning process. For example, one or more hard masks (not shown) might be formed atop dielectric layer 112 prior to formation of photoresist 114, in which embodiments the pattern from photoresist 114 would first be imposed upon the one or more hard masks and the patterned hard masks would be used in patterning dielectric layer 112. Generally, one or more hard mask layers may be useful in embodiments in which the etching process requires masking in addition to the masking provided by the photoresist material. During a subsequent etching process to pattern dielectric layer 112, the patterned photoresist mask will also be etched, although the etch rate of the photoresist material may not be as high as the etch rate of dielectric layer 112. If the etch process is such that the patterned photoresist mask may be consumed prior to completing the etching process on dielectric layer 112, then an additional hard mask may be utilized. The material of the hard mask layer or layers is selected such that the hard mask layer(s) exhibit a lower etch rate than the underlying materials, such as the materials of the dielectric layer 112.

Figure 4:
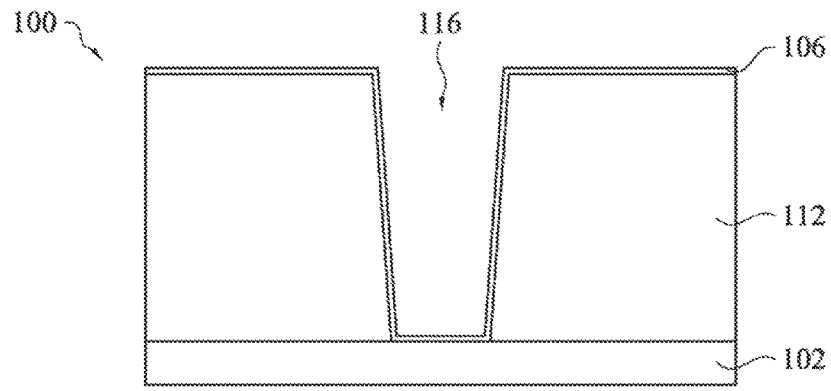

FIG. 4 illustrates the formation of a conductive film 106 on sidewalls and a bottom surface of opening 116. Conductive film 106 may further be disposed over dielectric layer 112. Conductive film 106 may be deposited using any suitable process such as a physical vapor deposition (PVD) process, CVD process, atomic layer deposition (ALD) process, and the like. Conductive film 106 may comprise a suitable conductive material having a suitable thickness for forming a silicide region on upper portions of substrate 102 (e.g., silicide region 104) in subsequent process steps. For example, in some embodiments, conductive film 106 may comprise W, Co, Ti, Ni, and the like having a thickness of about 30 Å to about 250 Å. In some embodiments, the material of conductive film 106 may further be selected to reduce the total number of process chambers needed to form contact plug 120. For example, when conductive film 106 and conductive core 110a both comprise W, the same process chamber may be reused to form different portions of contact plug 120.

Figure 5:
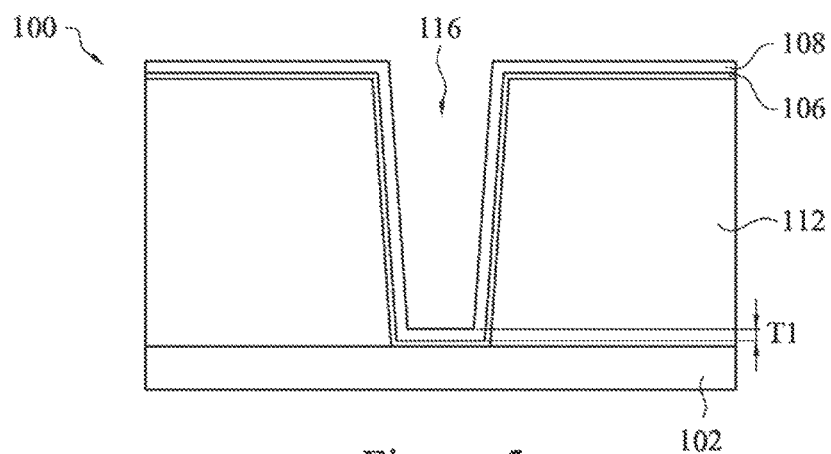

Next, in FIG. 5, a diffusion barrier layer 108 is formed atop conductive film 106. Diffusion barrier layer 108 may be disposed on sidewalls and a bottom surface of opening 116. Diffusion barrier layer 108 may comprise a low resistivity material such as Ta or TaN, and diffusion barrier layer 108 may have a thickness T1 of about 5 Å to about 100 Å. Diffusion barrier layer 108 may be deposited using any suitable process such as a physical vapor deposition (PVD) process, CVD process, atomic layer deposition (ALD) process, and the like. For example, diffusion barrier layer 108 may be formed by an ALD process under suitable process conditions (e.g., at a process temperature of about 100° C. to about 350° C.) using pentakis dimethylamido tantalum (PDMAT) as a precursor chemical.

Figure 6:
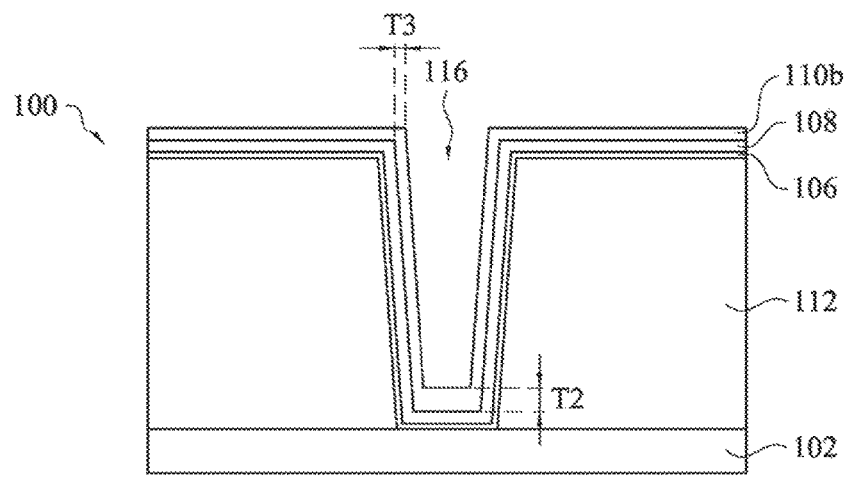
Figure 7:
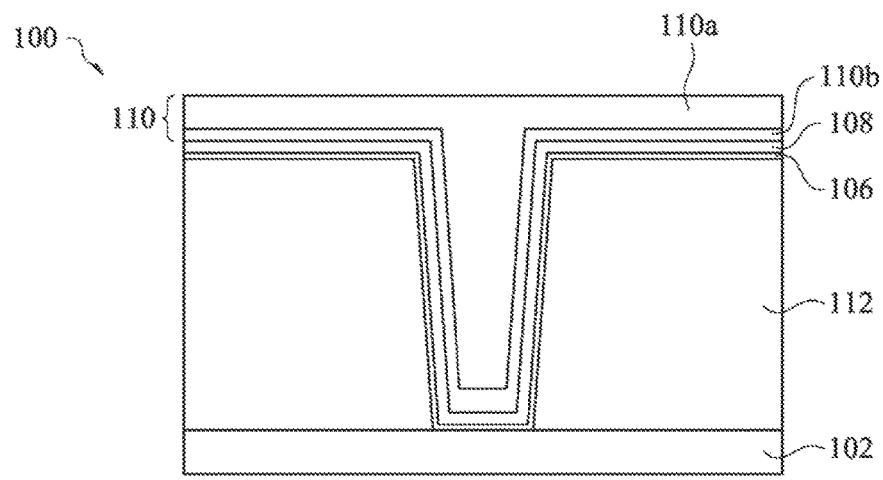

FIGS. 6 and 7 illustrate the formation of a bilayer structure 110 in contact plug 120 in accordance with some embodiments. First referring to FIG. 6, conductive liner 110b of bilayer structure 110 is formed atop diffusion barrier layer 108. Conductive liner 110b may be disposed on sidewalls and a bottom surface of opening 116. In some embodiments, conductive liner 110b may comprise Co or Ru. Conductive liner 110b may comprise a thickness T2 on a bottom surface of opening 116 and a thickness T3 on sidewalls of opening 116. In some embodiments, thickness T2 may be about 100 Å to about 2000 Å, and thickness T3 may be about 10 Å to about 200 Å. Conductive liner 110b may be deposited using any suitable process such as a physical vapor deposition (PVD) process, CVD process, atomic layer deposition (ALD) process, and the like. The specific process conditions used may vary depending on the material of conductive liner 110b. For example, when conductive liner 110b comprises Co, an ALD or CVD process may be employed using $C_{12}H_{10}O_6Co_2$ (e.g., at a process temperature of about 90° C. to about 350° C.), biscyclopentadienyl Co (e.g., at a process temperature of about at 100° C. to about 500° C.), or cyclopentadienyl dicarbonyl cobalt (e.g., at a process temperature of about at 100° C. to about 500° C.) as a precursor chemical. As another example, when conductive liner 110b comprises Ru, conductive liner 110b may be formed by an ALD or CVD process under suitable process conditions (e.g., at a process temperature of about at 100° C. to about 500° C.) using Ru(2-pentanedionate or 4-pentanedionate)$_3$, $Ru_3CO_{12}$, or $Ru(C_5H_5)_2$ as a precursor chemical.

Next, in FIG. 7, conductive core 110a of bilayer structure 110 may be disposed to fill remaining portions of opening 116. Conductive core 110a may further overfill opening 116 and cover a top surface of conductive liner 110b. In some embodiments, conductive core 110a may comprise Co, Ru, or W. The materials of conductive liner 110b and conductive core 110a may be different. For example, various embodiment bilayer structures 110 may comprise a Co conductive liner 110b with a W conductive core 110a, a Ru conductive liner 110b with a W conductive core 110a, a Ru conductive liner 110b with a Co conductive core 110a, or a Co conductive liner 110b with a Ru 110a. Conductive core 110a may be deposited using any suitable process such as a physical vapor deposition (PVD) process, CVD process, atomic layer deposition (ALD) process, and the like. It has been observed that the above combinations of conductive materials are suitable for bilayer structure 110 due to similar resistivity characteristics of Co, Ru, and W. Furthermore, the use of Co or Ru for conductive liner 110a provides for good adhesion (e.g., conductive liner 110a may act as a glue layer) and reduces diffusion of the material of conductive core 110a (e.g., conductive liner 110a may also act as a diffusion barrier layer). Thus, a low resistivity material (e.g., Ta or TaN) may be used for diffusion barrier layer 106, which further reduces the diffusion of the materials of bilayer structure 110 into surrounding device layers. Thus, bilayer structure 110 is formed in dielectric layer 112.

Figure 8:
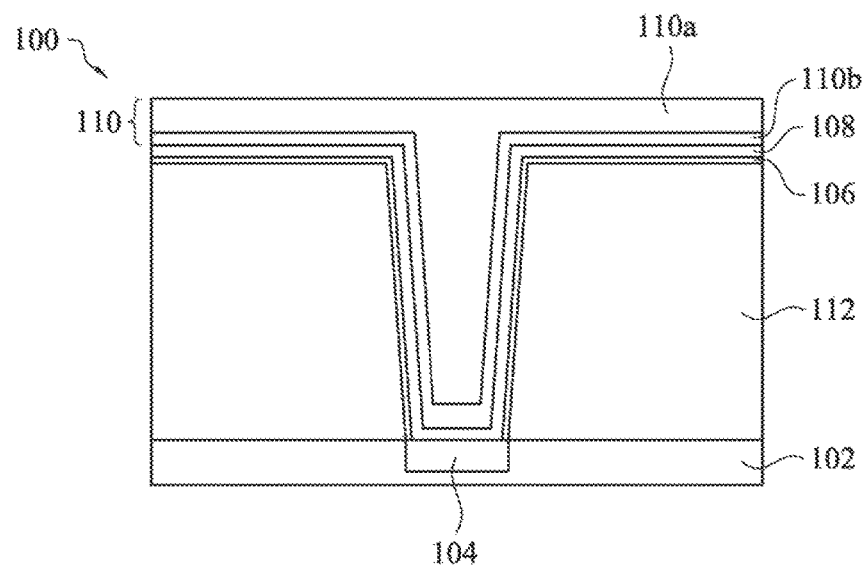
Figure 9:
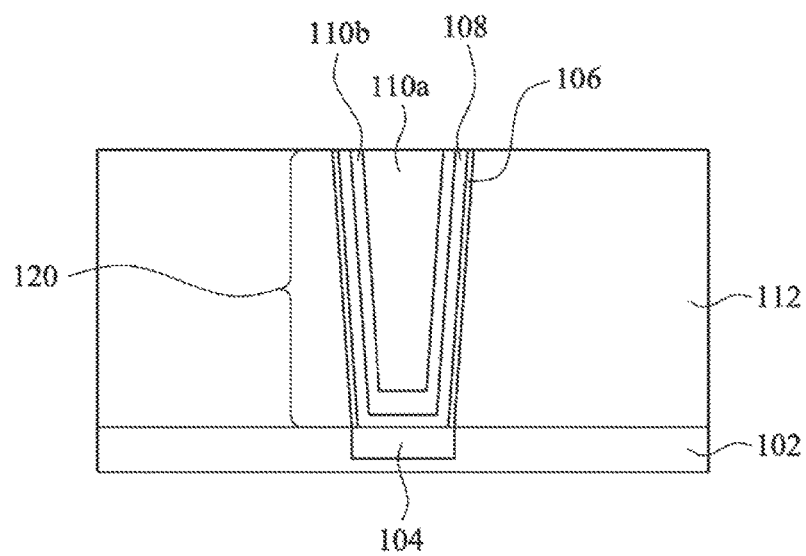

Referring next to FIG. 8, a silicide region 104 is formed on an upper portion of substrate 102 (e.g., a portion of substrate 102 in physical contact with conductive film 106). Silicide region 104 may be formed by diffusing the conductive material of conductive film 106 into upper portions of substrate 102. For example, an annealing process may be performed at a temperature of about 100° C. to about 900° C. using argon (Ar) or nitrogen ($N_2$) as a process gas under an atmospheric pressure of about 770 Torr to about 850 Torr. After annealing, bottom portions of conductive film 106 may be diffused into substrate 102 while portions of conductive film 106 on sidewalls of contact plug 120 may remain. In some embodiments, some conductive film 106 on a bottom surface of contact plug 120 may remain (e.g., bottom portions of conductive film 106 may not completely diffuse into upper portions of substrate 102). Alternatively, the material of substrate 102 (e.g., silicon) may diffuse into conductive film 106 to form silicide region 104. The diffusion of the conductive material of conductive film 106 may increase the conductivity of affected areas of substrate 102, thus forming a more suitable contact area (i.e., silicide region 104) for contact plug 120 to electrically connect to.

Subsequently, a planarization process (e.g., a chemical mechanical process (CMP) or grinding) may be performed to remove excess material (e.g., conductive film 106, diffusion barrier layer 108, and bilayer structure 110) from a top surface of dielectric layer 112. Other etch back techniques may also be employed. Thus, a composite contact plug 120 is formed in dielectric layer 112. Composite contact plug may include a conductive film 106, a diffusion barrier layer 108, and a bilayer structure 110. Bilayer structure 110 includes a conductive core 110a (e.g., comprising Co, Ru, or W) and conductive liner 110b (e.g., comprising Co or Ru) and on sidewalls and a bottom surface of conductive core 110a.

Figure 10:
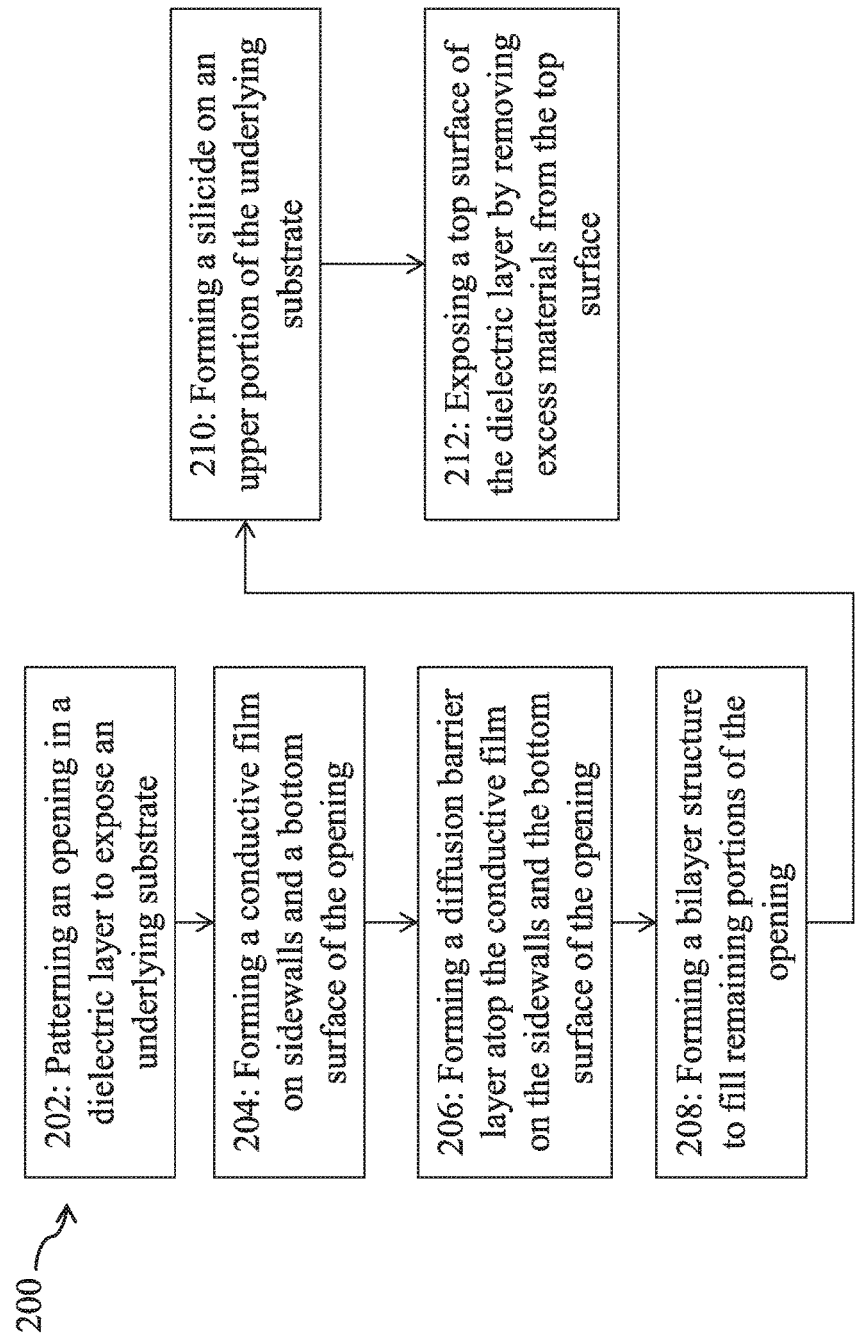
FIG. 10 illustrates a process flow for manufacturing a contact plug in accordance with some embodiments.

FIG. 10 illustrates a process flow 200 for forming a composite contact plug in accordance with some embodiments. Starting with step 202, an opening is patterned in a dielectric layer (e.g., dielectric layer 112) using a combination of photolithography and etching, for example. The opening may expose an underlying substrate region (e.g., substrate 102) for electrical connection, such as a source/drain region or a gate electrode. Next, in step 204, a conductive film (e.g., conductive film 106 comprising Co, W, Ti, Ni, and the like) may be deposited on sidewalls and a bottom surface of the opening. The conductive film may be used in a subsequent process step (e.g., step 210) to form a silicide region; therefore, in some embodiments, the conductive film may contact the exposed portion of the underlying substrate.

In step 206, a diffusion barrier layer (e.g., diffusion barrier layer 108) may be formed atop the conductive film on sidewalls and a bottom surface of the opening. For example, the conductive film is disposed between the diffusion barrier layer and the underlying substrate. Thus, the diffusion barrier layer may not interfere with the formation of a silicide region in an upper portion of the underlying substrate in subsequent process steps (e.g., step 210). The diffusion barrier layer may comprise a low resistivity material, such as Ta or TaN, and in some embodiments, the diffusion barrier layer may further have good adhesive properties and be used as a glue layer. In step 208, a bilayer structure (e.g., bilayer structure 110) is formed to fill remaining portions of the opening. The diffusion barrier layer may be disposed on sidewalls and a bottom surface of the bilayer structure to prevent or reduce diffusion of the material of the bilayer structure into surrounding device layers (e.g., the dielectric layer).

Forming the bilayer structure may include first depositing a Co or Ru comprising conductive liner (e.g., conductive liner 110b) atop the diffusion barrier layer on sidewalls and a bottom surface of the opening. Next, a Co, Ru, or W comprising conductive core (e.g., conductive core 110a) is deposited to fill remaining parts of the opening. The conductive core and the conductive liner may comprise different materials having similar resistivity properties. Various embodiments may include a Co or Ru conductive liner having a W conductive core, a Co conductive liner having a Ru conductive core, or a Ru conductive liner having a Co conductive core. The conductive liner may reduce diffusion and improve adhesion to facilitate the use of a low resistivity material for the diffusion barrier layer. Furthermore, sidewall angles and/or relative dimensions (e.g., thicknesses, heights, and the like) of the diffusion barrier layer, the conductive liner, and/or the conductive core may be selected to achieve a desired stress characteristic for the contact plug, which may be fine-tuned based on device design.

After the opening is filled with the various layers of the contact plug, a silicide region (e.g., silicide region 104) is formed in an upper portion of the underlying substrate. For example, an annealing process may be performed to diffuse the material of the conductive film into the underlying substrate to form the silicide region. The contact plug may be electrically connected to the silicide region. Finally, in step 212, a top surface of the dielectric layer is exposed by removing excess materials from the top surface using a suitable planarization process, such as a CMP process, a grinding process, or another etch back technique. Thus, a composite contact plug (e.g., contact plug 120) electrically connected to a silicided region of an underlying substrate is formed in a dielectric layer. In subsequent process steps, various additional interconnect structures (e.g., metallization layers having conductive lines and/or vias) may be formed over the dielectric layer. Such interconnect structures electrically connect the contact plug with other contact plugs and/or active devices to form functional circuits. Additional device features such as passivation layers, input/output structures, and the like may also be formed.

Various embodiments provide for a composite contact plug. The composite contact plug may include a bilayer structure having a Co or ruthenium Ru conductive liner on sidewalls and a bottom surface of a W, Ru, or Co conductive core, for example. The conductive liner and the conductive core may comprise different conductive materials having similar resistivity properties. A diffusion barrier layer comprising a low resistivity material (e.g., Ta or TaN) may further be disposed on sidewalls and a bottom surface of the composite contact plug. It has been observed that such a composite plug structure may be scaled down (e.g., for advanced node applications) while still maintaining low resistivity and good adhesion properties. Another advantageous feature of some embodiments is that the bilayer plug exhibits high activation energy and melting point, which provides for good electro-migration (EM) resistance and electrical performance. Furthermore, by controlling the sidewall angles and/or thickness ratios of various layers in the bilayer structure, the stress characteristics of the contact plug may be fine-tuned based on device design.

In accordance with an embodiment, a contact plug includes a bilayer structure and a diffusion barrier layer on a sidewall and a bottom surface of the bilayer structure. The bilayer structure includes a conductive core and a conductive liner on a sidewall and a bottom surface of the conductive core. In an embodiment contact plug, the conductive liner comprises cobalt or ruthenium.

In accordance with another embodiment, a semiconductor device includes a dielectric layer and a contact plug extending through the dielectric layer. The contact plug includes a conductive core, a conductive liner on sidewalls and a bottom surface of the conductive core, and a diffusion barrier layer on sidewalls and a bottom surface of the conductive liner. The conductive liner comprises cobalt or ruthenium, and the conductive liner is disposed between the diffusion barrier layer and the conductive core. The semiconductor device further includes a silicide region under the dielectric layer, where the contact plug is electrically connected to the silicide region.

In accordance with yet another embodiment, a method for forming a contact plug includes forming a dielectric layer over a substrate and patterning an opening in the dielectric layer exposing the substrate. The method further includes forming a diffusion barrier layer in the opening and forming a conductive liner on sidewalls and a bottom surface of the diffusion barrier layer. The conductive liner comprises cobalt or ruthenium. A conductive core is formed in the opening. The conductive core and the conductive liner comprise different conductive materials, and the conductive liner is disposed between the conductive core and the diffusion barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A conductive structure comprising:
   a conductive core disposed in a dielectric layer of an integrated circuit chip;
   a conductive liner in direct contact with and comprising a different material than the conductive core, wherein the conductive liner has a substantially constant thickness along an entirety of a sidewall of the conductive core, wherein the conductive liner comprises cobalt or ruthenium, and wherein the conductive liner is thinner along the sidewall of the conductive core than along a bottom surface of the conductive core; and
   a diffusion barrier layer on a sidewall and a bottom surface of the conductive liner.

2. The conductive structure of claim 1, further comprising a conductive film on a sidewall of the diffusion barrier layer, wherein the diffusion barrier layer is disposed between the conductive film and the conductive liner.

3. The conductive structure of claim 2, wherein the conductive film comprises titanium, cobalt, nickel, or tungsten.

4. The conductive structure of claim 2, wherein the conductive film is not disposed along at least a portion of a bottom surface of the diffusion barrier layer.

5. The conductive structure of claim 1, wherein the conductive core comprises tungsten, cobalt, or ruthenium.

6. The conductive structure of claim 1, wherein a thickness of the conductive liner along the sidewall of the conductive core is greater than a thickness of the diffusion barrier layer.

7. The conductive structure of claim 1, wherein the conductive liner is at least ten times thinner along the sidewall of the conductive core than along the bottom surface of the conductive core.

8. A semiconductor device comprising:
   a dielectric layer;
   a contact plug in the dielectric layer, the contact plug comprising:
      a conductive core;
      a conductive liner along sidewalls and a bottom surface of the conductive core, the conductive liner and the conductive core having different material compositions, a first portion of the conductive liner under the conductive core has a first thickness measured between opposing lateral surfaces of the first portion, wherein a second portion of the conductive liner along a sidewall of the conductive core has a second thickness measured between opposing sidewalls of the second portion, wherein the conductive liner has a uniform thickness from a top surface of the conducive core to the bottom surface of the conductive core, and wherein the second thickness is less than the first thickness; and
      a diffusion barrier layer along sidewalls and a bottom surface of the conductive liner, wherein the conductive liner is disposed between the diffusion barrier layer and the conductive core; and
   a silicide region under the dielectric layer, wherein the contact plug extends to the silicide region.

9. The semiconductor device of claim 8, wherein the contact plug further comprises a conductive film disposed between a sidewall of the diffusion barrier layer and a sidewall of the dielectric layer.

10. The semiconductor device of claim 9, wherein the silicide region comprises a combination of silicon and a conductive material of the conductive film.

11. The semiconductor device of claim 8, wherein the conductive core comprises tungsten, ruthenium, or cobalt, and wherein the conductive liner comprises cobalt or ruthenium, and wherein the diffusion barrier layer comprises tantalum or tantalum nitride.

12. A method for forming a contact plug, the method comprising:
   depositing a dielectric layer over a substrate;
   patterning an opening in the dielectric layer, the opening exposing a portion of the substrate;
   depositing a diffusion barrier layer in the opening;
   depositing a conductive liner on sidewalls and a bottom surface of the diffusion barrier layer, wherein, as deposited, the conductive liner is thinner on the sidewalls of the diffusion barrier layer than on the bottom surface of the diffusion barrier layer, wherein depositing the conductive liner comprises depositing cobalt or ruthenium; and
   depositing a conductive core in the opening over the conductive liner, wherein the conductive core and the conductive liner have different material compositions.

13. The method of claim 12, wherein depositing the diffusion barrier layer comprises depositing tantalum or tantalum nitride.

14. The method of claim 12, wherein depositing the conductive core comprises depositing cobalt, ruthenium, or tungsten.

15. The method of claim 12, further comprising, before depositing the diffusion barrier layer, depositing a conductive film on a bottom surface of the opening.

16. The method of claim 15, further comprising after depositing the conductive core, annealing the conductive film to define a silicide region in an upper portion of the substrate.

17. The method of claim 16, further comprising after defining the silicide region, removing portions of the diffusion barrier layer, conductive liner, and conductive core disposed over a topmost surface of the dielectric layer.

18. The method of claim 12, wherein the conductive liner has a constant thickness along an entirely of a sidewall of the conductive core.

19. The method of claim 12, wherein the portion of the substrate is a portion of source/drain region or a portion of a gate electrode.

* * * * *